US006821856B2

(12) United States Patent
Takagi (10) Patent No.: US 6,821,856 B2
(45) Date of Patent: Nov. 23, 2004

(54) METHOD OF MANUFACTURING SEMICONDUCTOR DEVICE HAVING SOURCE/DRAIN REGIONS INCLUDED IN A SEMICONDUCTOR LAYER FORMED OVER AN ISOLATION INSULATING FILM AND A SEMICONDUCTOR DEVICE FABRICATED THEREBY

(75) Inventor: Takeshi Takagi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/188,108

(22) Filed: Jul. 3, 2002

(65) Prior Publication Data

US 2003/0008452 A1 Jan. 9, 2003

(30) Foreign Application Priority Data

Jul. 4, 2001 (JP) ........................................ 2001-202939

(51) Int. Cl.[7] ............................................. H01L 21/336
(52) U.S. Cl. ........................ 438/294; 438/289; 438/299
(58) Field of Search ................................. 438/289, 291, 438/300, 218, 294, 299

(56) References Cited

U.S. PATENT DOCUMENTS

| 5,773,328 A | 6/1998 | Blanchard |
| 5,872,039 A | 2/1999 | Imai |
| 6,174,754 B1 * | 1/2001 | Lee et al. ................... 438/142 |
| 6,472,685 B2 | 10/2002 | Takagi |

FOREIGN PATENT DOCUMENTS

| EP | 0 921 575 | 6/1999 |
| JP | 59-220972 | 12/1984 |
| JP | 9-22950 | 1/1997 |
| JP | 09186319 | 7/1997 |
| JP | 11008389 | 1/1999 |
| JP | 11-74522 | 3/1999 |
| JP | 11233771 | 8/1999 |

OTHER PUBLICATIONS

H. Kotaki et al., "Novel Low Capacitance Sidewall Elevated Drain Dynamic Threshold Voltage MOSFET (LCSED) for Ultra Low Power Dual Gate CMOS Technology", IEEE, IDEM 98, pp. 415–418, 1998.

* cited by examiner

*Primary Examiner*—Van Thu Nguyen
*Assistant Examiner*—Brad Smith
(74) *Attorney, Agent, or Firm*—McDermott Will & Emery LLP (57) ABSTRACT

A semiconductor device comprises an Si substrate, an isolation insulating film formed on the Si substrate, an Si layer formed on the Si substrate, a gate oxide film formed on the Si layer, a gate electrode formed on the gate oxide film, a sidewall formed on the side face of the gate electrode, a gate silicide film formed on the gate electrode, source and drain regions formed at both the sides of the gate electrode and including a part of the Si layer, and a silicide film formed on the source and drain regions. Because the source and drain regions are formed on a layer-insulating film so as to be overlayed, it is possible to decrease the active region and cell area of a device. Thereby, a high-speed operation and high integration can be realized.

10 Claims, 11 Drawing Sheets

METHOD OF MANUFACTURING SEMICONDUCTOR DEVICE HAVING SOURCE/DRAIN REGIONS INCLUDED IN A SEMICONDUCTOR LAYER FORMED OVER AN ISOLATION INSULATING FILM AND A SEMICONDUCTOR DEVICE FABRICATED THEREBY

BACKGROUND OF THE INVENTION

The present invention relates to a semiconductor device and its fabrication method, particularly to a MIS transistor whose integration degree is improved and its fabrication method.

Because a device has been further fined in recent years, it has been necessary to reduce parasitic capacitance between body region and source and drain regions in order to improve the operation speed of a MIS transistor. Further, it is also a subject to decrease the cell area and realize high integration of a semiconductor device.

Figure 11A:
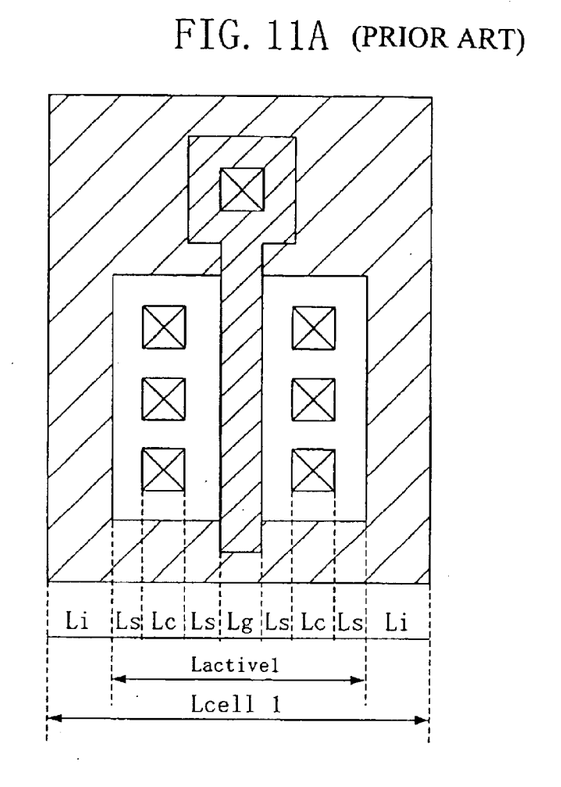
FIGS. 11A and 11B are a top view and a sectional view of a conventional MOS transistor respectively.
Figure 11B:
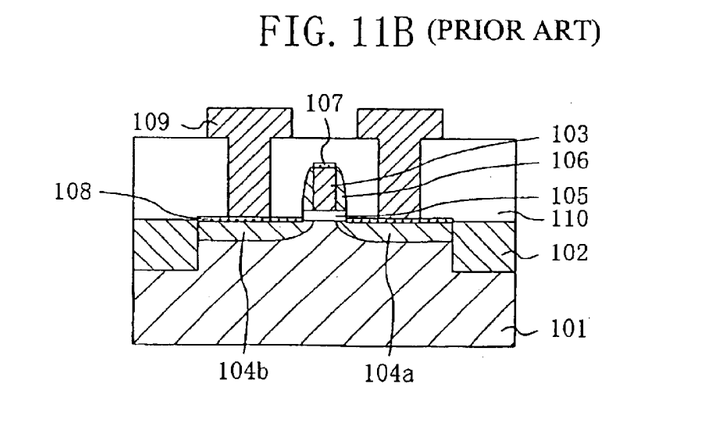

FIGS. 11A and 11B are a top view and a sectional view of a conventional MOS transistor.

As shown in FIGS. 11A and 11B, the conventional MOS transistor includes an Si substrate 101 containing p-type impurities, an isolation insulating film 102 formed on the p-type Si substrate 101, a gate-insulating film 105 made of silicon oxide ($SiO_2$) formed on the Si substrate 101, a gate electrode 103 made of polysilicon containing n-type impurities formed on the gate-insulating film 105, a sidewall 106 formed on the side face of the gate electrode, source and drain regions 104a and 104b formed in regions located at the both sides of the gate electrode in the Si substrate 101 and respectively containing n-type impurities, a gate silicide film 107 formed on the gate electrode 103, a silicide film 108 formed on the source and drain regions 104a and 104b respectively, a layer-insulating film 110 formed on the substrate, and a plug 109 passing through the layer-insulating film 110 and reaching the silicide film 108 on the source and drain regions 104a and 104b.

Though the transistor is a general n-channel MOS transistor, the structure is the same as that of a p-channel MOS transistor.

In the case of a conventional MOS transistor, the cell area is decreased by mainly decreasing the gate length.

However, in the case of the conventional MOS transistor shown in FIGS. 11A and 11B, it is difficult to greatly decrease the device area because it is necessary to develop a new fabrication technology for realizing microfabrication and the device area can hardly be decreased because the transistor is already microfabricated.

However, an example of realizing a high-speed operation by improving the MOS transistor, decreasing the area of an active region, and reducing a parasitic capacitance is reported (H. Kotaki et al., "Novel Low Capacitance Sidewall Elevated Drain Dynamic Threshold MOSFET (LCSED) for Ultra Low Power Dual Gate CMOS Technology", IEDM98 Ext. Abst. p. 415).

In the case of the above example, a stacked source-drain structure is used in order to reduce an active region. Thereby, the area of the active region is reduced and it is possible to decrease a parasitic capacitance.

However, in the case of the above example, though the area of the active region and the parasitic capacitance are decreased, a trouble occurs that the parasitic capacitance cannot be completely reduced because a new extra capacitance is generated on a gate electrode and between the stacked source and drain. Moreover, a trouble occurs that the fabrication process becomes complex.

SUMMARY OF THE INVENTION

It is an object of the present invention to provide a semiconductor device in which areas of an active region and a cell are reduced and a high-speed operation and a high integration can be realized and its fabrication method.

A semiconductor device of the present invention comprises a semiconductor substrate having an active region; an isolation insulating film formed on the semiconductor substrate to surround the active region; a semiconductor layer formed over the active region and part of the isolation insulating film; a gate-insulating film formed on part of the semiconductor layer which is located on the active region; a gate electrode made of a conductive film formed on the gate-insulating film; and source and drain regions formed in parts of the semiconductor layer which are located closer to both sides of the gate electrode; wherein at least parts of the semiconductor layer which is located over the isolation insulating film serves as the source and drain regions.

Thereby, because source and drain regions are also formed on the isolation insulating film, it is possible to decrease the area of the active region and the cell area and resultantly further increase the integration degree of a device than ever. Moreover, because a source-body junction area and drain-body junction area can be decreased, it is possible to reduce a parasitic capacitance. Therefore, the parasitic capacitance is not increased compared to the case of a conventional semiconductor device even if the impurity concentration in a substrate is raised.

When the semiconductor layer is a single-crystal layer on the active region and a polycrystalline layer over the isolation insulating film, the semiconductor layer on the active region can show a superior electrical characteristic as a channel and the semiconductor layer above the isolation insulating film can show a superior electrical characteristic as source and drain regions having a small electric resistance.

When the semiconductor device of the present invention further comprises a wiring connected to the source and drain regions and at least a part of the contact region between the wiring and the source and drain regions is formed above the isolation insulating film, it is possible to greatly decrease a cell area compared to the case of a conventional semiconductor device having a contact region above an active region.

Moreover, in a region of the semiconductor layer located on the isolation insulating film, a base semiconductor layer is formed between the semiconductor layer and the isolation insulating film. Thereby, it is possible to securely form a semiconductor layer above the isolation insulating film.

Furthermore, part of the semiconductor layer which is located over part of the isolation insulating film may have a greater thickness than part of the semiconductor layer which is located on the active region.

When the semiconductor substrate and the semiconductor layer are both made of silicon, it is possible to use the conventional fabrication equipment of a MOS transistor and therefore, easily fabricate a device and reduce the fabrication cost.

When the semiconductor layer contains at least either of germanium and carbon and thereby, the carrier mobility in the crystals such as SiGe and SiGeC is higher than the case of individual Si, it is possible to accelerate the operation speed of a device by using these crystals as channel layers. Moreover, SiGe and SiGeC respectively have a smaller band gap than that of individual Si, it is possible to lower a threshold voltage.

When the semiconductor substrate has an SOI structure and thereby, the parasitic capacitance between wirings is reduced, it is possible to further accelerate the operation speed of a device.

When the gate electrode is electrically connected with the body region in the semiconductor substrate located immediately below the gate electrode, it is possible to lower a threshold voltage when a gate bias is on. Moreover, because a longitudinal electric field on the surface of the substrate is small, it is possible to prevent deterioration of mobility due to increase of the longitudinal electric field and increase a driving force.

A first fabrication method of a semiconductor device of the present invention comprises a step (a) of forming an isolation insulating film for surrounding an active region in a semiconductor substrate having the active region, a step (b) of growing a semiconductor layer over the active region and a part of the isolation insulating film, a step (c) of forming a gate-insulating film and a gate electrode in the region located on the semiconductor layer on the active layer, and a step (d) of performing implantation of impurity ions and forming source and drain regions in parts of the semiconductor layer which are located closer to both sides of the gate electrode formed in the step (c).

According to the above method, it is possible to efficiently fabricate a semiconductor device of the present invention. Moreover, because the fabrication equipment of a conventional semiconductor device can be directly used, it is possible to suppress increase of the fabrication cost.

When, in the above step (b), the semiconductor layer is a single-crystal layer on the active region and a polycrystalline layer over the isolation insulating film, it is possible to form a region serving as source and drain regions later by a polycrystalline semiconductor. Therfore, it is possible to make the semiconductor layer as source and drain electrodes.

Moreover, a second fabrication method of a semiconductor device of the present invention comprises a step (a) of forming an isolation insulating film for surrounding the active region in a semiconductor substrate having an active region, a step (b) of depositing a first semiconductor layer on the substrate and then forming a base semiconductor layer over a part of the isolation insulating film through patterning, a step (c) of forming on the substrate a second semiconductor layer over the active region and a part of the isolation insulating film, a step (d) of forming a gate-insulating film and a gate electrode on part of the second semiconductor layer which is located on the active region, and a step (e) of performing implantation of impurity ions and forming source and drain regions in parts of the first and the second semiconductor layers which are located closer to both sides of the gate electrode formed in the step (d).

According to the method, when the base semiconductor layer is formed above the isolation insulating film before the step (c) of forming the second semiconductor layer above the isolation insulating film in the step (b), it is possible to securely form the second semiconductor layer also above the isolation insulating film. Therefore, it is possible to make an electrode formed in the source and drain regions smoothly function.

When, in the step (c), the second semiconductor layer is a single-crystal layer on the active region and a polycrystalline layer on the isolation insulating film, it is possible to make the second semiconductor layer on the active region function as a channel and decrease the resistance in the source and drain regions.

The base semiconductor layer is preferably made of polycrystalline semiconductor.

DETAILED DESCRIPTION OF THE INVENTION

Embodiment 1

Figure 1A:
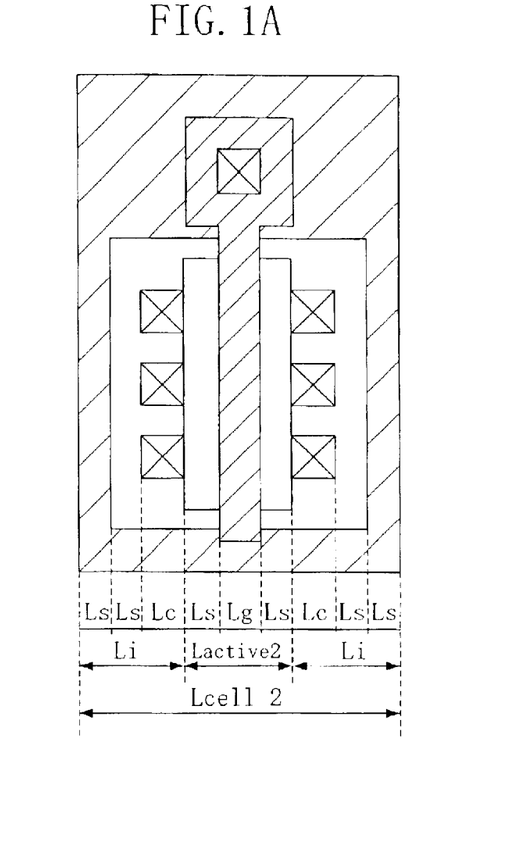
FIGS. 1A and 1B are a top view and a sectional view of a MOS transistor of a first embodiment of the present invention respectively.
Figure 1B:
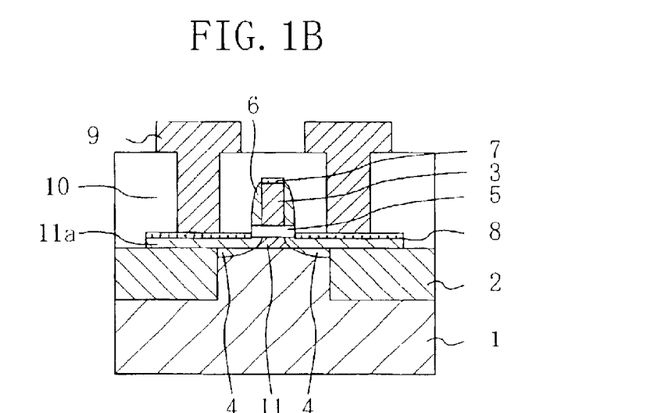

FIGS. 1A and 1B are a top view and a sectional view of the MOS transistor of this embodiment respectively. As shown in FIGS. 1A and 1B, the MOS transistor of this embodiment includes an Si substrate 1 having an active region containing p-type impurities, an isolation insulating film 2 made of $SiO_2$ formed on the Si substrate 1, an Si layer 11a deposited over the active region of the Si substrate 1 and part of the isolation insulating film 2 by using the LPCVD method, a gate oxide film 5 made of $SiO_2$ formed on the Si layer 11a, a gate electrode 3 made of polysilicon formed on the gate oxide film 5, a sidewall 6 formed on the side face of the gate electrode 3, a gate silicide film 7 made of $TiSi_2$ formed on the gate electrode 3, source and drain regions 4 containing n-type impurities at a high concentration formed in parts of the Si layer 11a and upper portion of the Si substrate 1 which are located closer to both sides of the gate electrode 3 (regions excluding the portion immediately below the gate electrode 3), a silicide film 8 made of $TiSi_2$ formed on the source and drain regions 4, a layer-insulating film 10 made of $SiO_2$ formed on the substrate, and a plug 9 passing through the layer-insulating film 10 and reaching the silicide film 8. Moreover, a part of the Si layer 11a which is located on the isolation insulating film 2 is made of polysilicon and a part of the Si layer 11a which is located on the active region of the Si substrate 1 is made of epitaxially-grown single-crystal silicon. Particularly, the portion immediately below the gate electrode 3 of the Si layer 11a functions as a channel region 11.

The MOS transistor of this embodiment has features that a part of the source and drain regions 4 is overlayed on the isolation insulating film 2 and source and drain electrodes are formed over the active region and part of the isolation insulating film. That is, at least a part of the contact region between the wiring (plug 9) and the source and drain regions 4 is formed above the isolation insulating film 2.

Thus, by using the above structure, it is possible to minimize the area of the active region and decrease the source-body junction area and drain-body junction area. Thereby, because the parasitic capacitance between the gate electrode 3 and the source and drain regions 4 can be decreased, it is possible to realize a high-speed operation of a transistor. Moreover, because the cell size of a transistor can be decreased, it is possible to improve an integration degree compared to that of a conventional MOS transistor.

In the case of this embodiment, an n-channel MOS transistor is used as an example. However, it is also allowed that a transistor is a p-channel MOS transistor.

Then, the reduction effect of the active-region width and cell width of the MOS transistor of this embodiment will be described below in comparison with a conventional MOS transistor.

In FIGS. 1A and 11A, the width (Lactive1) of an active region of a conventional MOS transistor is equal to Lg+2 (2Ls+Lc) while the width (Lactive2) of the active region of the MOS transistor of this embodiment is equal to Lg+2Ls. In this case, Lg denotes a gate length, Ls denotes a margin, and Lc denotes an electrode contact length. The margin, electrode contact length, and gate length are the same in this embodiment and the conventional example.

The active-region width decreased by the MOS transistor of this embodiment ΔLactive becomes equal to Lactive2−Lactive1=2(Ls+Lc). In the case of the MOS transistor of this embodiment, it is understood that the active-region width is decreased.

The transistor-cell width (Lcell 1) of a conventional MOS transistor is equal to Lg+2(2Ls+Lc+Li) while the transistor-cell width (Lcell 2) of the MOS transistor of this embodiment is equal to Lg+2(Ls+Li)=Lg+2(3Ls+Lc). In this case, Li denotes a length of a device-separation region.

The transistor-cell width reduced by the MOS transistor of this embodiment ΔLcell becomes equal to 2(Ls+Lc)=2(Li−Ls). Usually, because Li is larger than Ls, it is understood that the transistor-cell width is also reduced by the MOS transistor of this embodiment.

Then, a fabrication method of the MOS transistor of this embodiment will be described below by referring to the accompanying drawings.

FIGS. 2A to 2D and FIGS. 3A to 3D are sectional views showing fabrication steps of the MOS transistor of this embodiment.

Figure 2A:
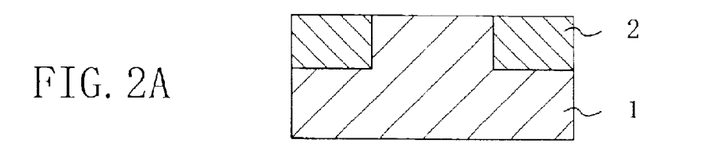
FIGS. 2A to 2D are sectional views showing steps up to a step of forming a gate electrode among fabrication steps of the MOS transistor of the first embodiment of the present invention.

First, in the step shown in FIG. 2A, the isolation insulating film 2 made of $SiO_2$ is formed on the Si substrate 1 in accordance with the Shallow Trench Isolation (STI) technique. Then, p-type impurities are ion-implanted into the Si substrate 1 to form a body (well) region.

Figure 2B:
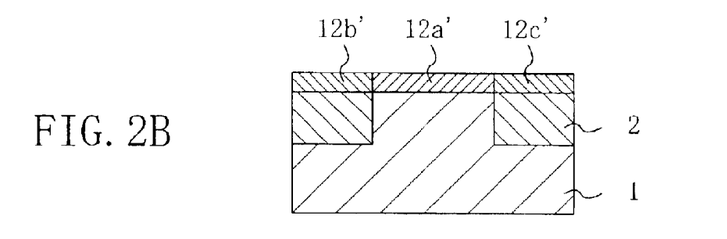

Then, in the step shown in FIG. 2B, an undoped Si layer is deposited on the Si substrate 1 in accordance with the LPCVD method. In this case, an epitaxially-grown single-crystal Si layer 12a' is formed on the upper face of the Si substrate 1 and a polysilicon layer 12b' and a polysilicon layer 12c' are formed on the isolation insulating film 2 at the same time. In this case, it is important to adjust conditions so that polycrystalline silicon (polysilicon) is formed on the isolation insulating film 2. The expression "undoped" in this specification denotes a state in which a step of introducing impurity ions is not executed.

Figure 2C:
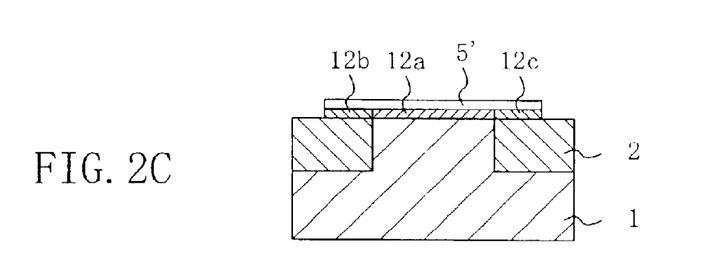

Then, in the step shown in FIG. 2C, for separation from an adjacent transistor, the single-crystal Si layer 12a', polysilicon layer 12b', and polysilicon layer 12c' are dry-etched to form polysilicon layers 12b and 12c on the isolation insulating film 2 and form a single-crystal Si layer 12a between the polysilicon layers 12b and 12c on the Si substrate 1. Then, the polysilicon layers 12b and 12c and the single-crystal Si layer 12a are oxidized through a thermal treatment to form a silicon oxide film 5' made of $SiO_2$ on the polysilicon layers 12b and 12c and the single-crystal Si layer 12a respectively.

Figure 2D:
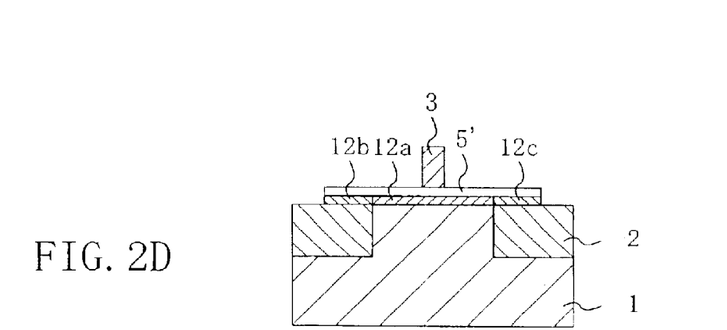

Then, in the step shown in FIG. 2D, a polysilicon layer is deposited on the substrate by the CVD method and then, the polysilicon layer is patterned by using a resist mask to form the gate electrode 3 on the silicon oxide film 5'. In this case, though not illustrated, it is also allowed to perform implantation of n-type-impurity ions by using the gate electrode 3 as a mask and form an extension region in parts of the substrate which are located closer to the both sides of the gate electrode.

Figure 3A:
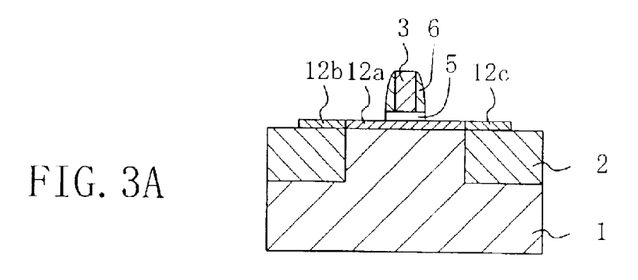
FIGS. 3A to 3D are sectional views showing steps up to a step of forming a layer-insulating film and a contact plug among fabrication steps of the MOS transistor of the first embodiment of the present invention.

Then, in the step shown in FIG. 3A, SiN is deposited on the substrate and then the SiN layer is dry-etched to form the sidewall 6 on the side face of the gate electrode 3. Then, the silicon oxide film 5' is dry-etched to form a gate oxide film 5 between the Si substrate 1 and the gate electrode 3.

Figure 3B:
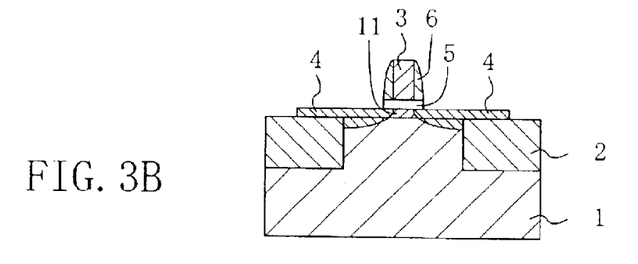

Thereafter, in the step shown in FIG. 3B, n-type impurities are ion-implanted into both the sides of the gate electrode 3 and both the sides of the gate electrode 3 of the upper portion of the Si substrate 1 among the polysilicon layers 12b and 12c and the single-crystal Si layer 12a by using the gate electrode 3, sidewall 6 and gate oxide film 5 as masks to form the source and drain regions 4. In this case, part of the single-crystal Si layer 12a which is located immediately below the gate electrode 3 becomes the channel region 11 functioning as a channel. The polysilicon layers 12b and 12c and the single-crystal Si layer 12a are united and shown as the Si layer 11a.

Figure 3C:
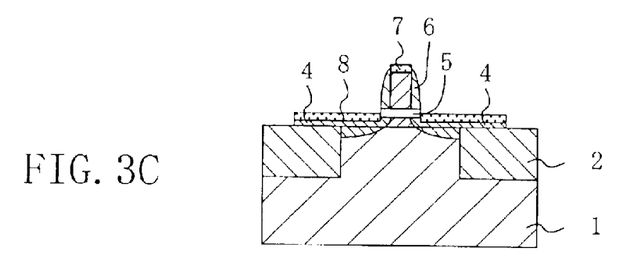

Then, in the step shown in FIG. 3C, Ti (titanium) is deposited on the substrate to form the gate silicide film 7 made of $TiSi_2$ on the gate electrode 3 and the silicide film 8 made of $TiSi_2$ on the source and drain regions 4 by thermally treating the substrate.

Figure 3D:
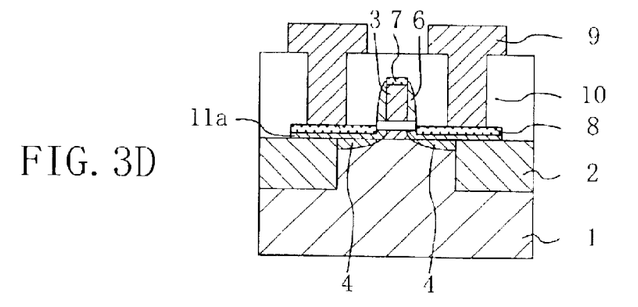

Then, in the step shown in FIG. 3D, the layer-insulating film 10 made of $SiO_2$ is formed on the substrate by thermally decomposing TEOS (ethyl silicate) and then form a contact hole reaching the suicide film 8 by making openings in the layer-insulating film 10 through anisotropic etching. Thereafter, the plug 9 is formed by filling the contact hole with Al (aluminum).

In the above step shown in FIG. 2B, by adjusting the condition for depositing silicon, the epitaxially-grown single-crystal Si layer 12a is formed on the Si substrate 1 and the polysilicon layers 12b and 12c are formed on the isolation insulating film 2 at the same time. Because the polysilicon layers 12b and 12c are formed on the isolation insulating film 2, it is possible to make the portion function as source and drain electrodes by transforming the portion into silicide.

Moreover, in the case of the fabrication method of the MOS transistor of this embodiment, the area of a transistor cell is decreased by combining MOS-transistor fabrication techniques conventionally known such as the CVD method and patterning technique. This represents that it is possible to directly use the conventional fabrication equipment and that the MOS transistor of this embodiment is produced without raising the fabrication cost.

Moreover, in the step shown in FIG. 2B, because the single-crystal Si layer 12a including the portion serving as the channel region 11 is epitaxially grown, it is possible to easily realize a retrograde channel profile obtained by raising the impurity concentration of the substrate and forming the undoped single-crystal Si layer 12a. According to this structure, carriers moving in the channel region 11 are not influenced by scattering of impurities and it is possible to realize a MOS transistor capable of operating at a high speed and a low threshold voltage. Moreover, by raising the impurity concentration in the substrate, it is possible to prevent a punch-through from easily occurring and control a short-channel effect.

Furthermore, in the case of the fabrication method of the MOS transistor of this embodiment, it is possible to freely adjust the active-region width surrounded by the isolation insulating film 2 in the step shown in FIG. 2A.

Figure 8:
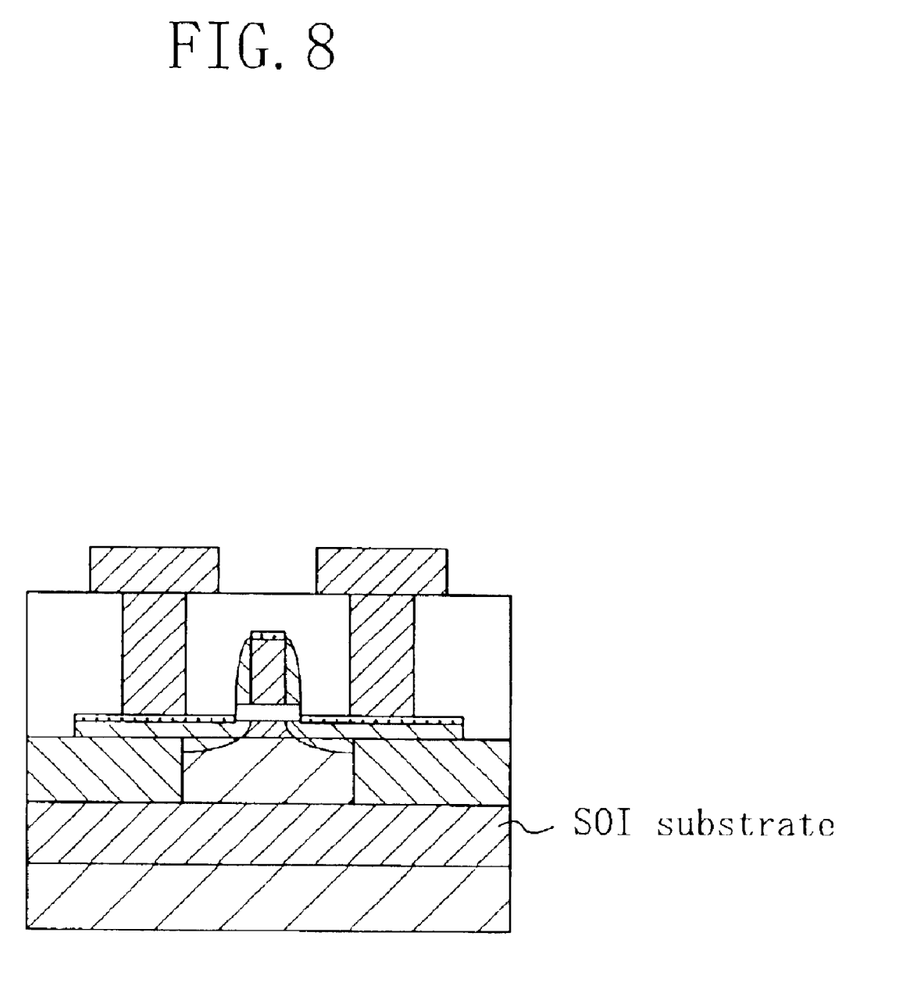
FIG. 8 is a sectional view showing a modification of the MOS transistor of the first embodiment of the present invention using an SOI substrate.

FIG. 8 is a sectional view of the MOS transistor of this embodiment when using an SOI substrate for the transistor. Though a case of using an Si bulk substrate for the MOS transistor of this embodiment is described, it is also possible to use an SOI substrate as shown in FIG. 8. Thereby, because the volume of the active region is decreased compared to the case of a conventional MOS transistor and the parasitic capacitance can be decreased, it is possible to more effectively use the feature of the SOI substrate that the substrate is advantageous to improve the integration degree.

Though an n-channel MOS transistor is used as an example for this embodiment, it is possible to fabricate a p-channel MOS transistor in accordance with the same method.

Moreover, even in the case of not only a MOS transistor but also a semiconductor device including a nonvolatile memory such as an MIS transistor having a source and a drain or an MFIS (Metal-Ferroelectric-Insulator-Semiconductor) provided with an MIS transistor, it is possible to decrease areas of an active region and a transistor cell by forming a part of source and drain regions on an isolation insulating film.

In the case of this embodiment, the channel region 11 made of single crystal Si functions as a channel. However, another region may function as a channel in accordance with a change of conditions.

Embodiment 2

In the case of this embodiment, another method for fabricating the MOS transistor of the first embodiment will be described below.

FIGS. 4A to 4D and FIGS. 5A to 5D are sectional views showing fabrication steps of the MOS transistor of this embodiment.

Figure 4A:
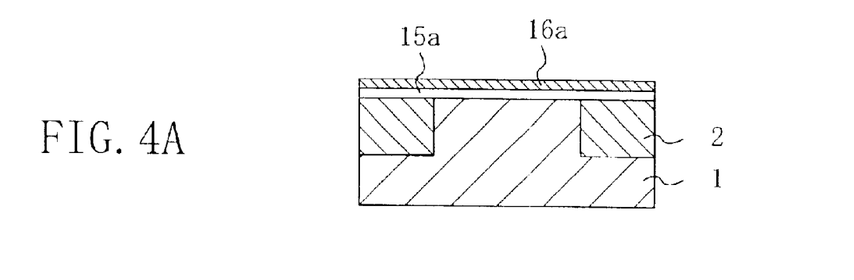
FIGS. 4A to 4D are sectional views showing steps up to a step of forming a silicon oxide film on a substrate among fabrication steps of a MOS transistor of a second embodiment of the present invention.

In the step shown in FIG. 4A, an isolation insulating film 2 made of $SiO_2$ is formed on an Si substrate 1 in accordance with the STI technique. Then, p-type impurities are ion-implanted into the Si substrate 1 to form a body (well) regions. Then, a silicon oxide film 15a made of $SiO_2$ is formed on the substrate in accordance with the LPCVD method. Then, polysilicon is deposited on the silicon oxide film 15a in accordance with the LPCVD method to form a polysilicon layer 16a. In this case, the silicon oxide film 15a is formed to prevent the Si substrate 1 from being etched or damaged when dry-etching a polysilicon layer 16a later.

Figure 4B:
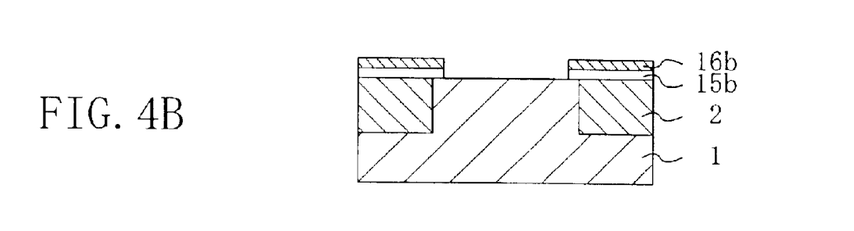

Then, in the step shown in FIG. 4B, the upper portion of the active region of the polysilicon layer 16a is removed through dry etching to leave a polysilicon layer 16b. Then, a part of the silicon oxide film 15a over the active region is removed through wet etching to leave a silicon oxide film 15b. However, ends of the polysilicon layer 16b and the silicon oxide film 15b are formed so as to cover the active region.

Figure 4C:
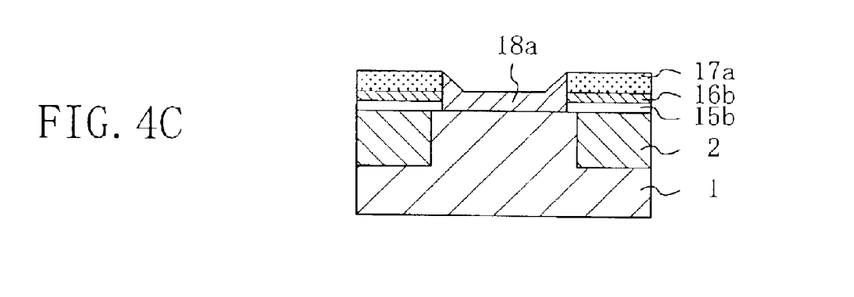

Then, in the step shown in FIG. 4C, undoped silicon is deposited on the substrate in accordance with the LPCVD method. In this case, an epitaxially-grown single-crystal Si layer 18a is formed on the Si substrate 1 and a polysilicon layer 17a is formed on the polysilicon layer 16b. Steps from this step downward are basically the same as those of the first embodiment.

Figure 4D:
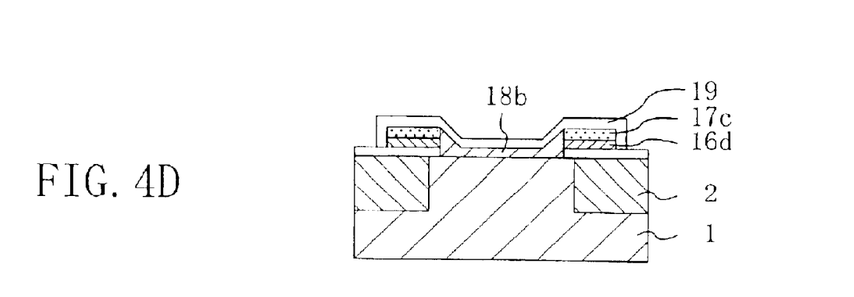

Then, in the step shown in FIG. 4D, the polysilicon layers 17a and 16b are etched by using a resist mask to remove outside ends of both the layers and leave polysilicon layers 17b and 16c (both are not illustrated). This processing is performed for isolation from an adjacent transistor. Then, exposed faces of the polysilicon layers 16c and 17b and the single-crystal Si layer 18a are thermally oxidized to form a silicon oxide film 19 on the exposed face of each layer. Portions of the layers that are not oxidized become polysilicon layers 16d and 17c and single-crystal Si layer 18b.

Figure 5A:
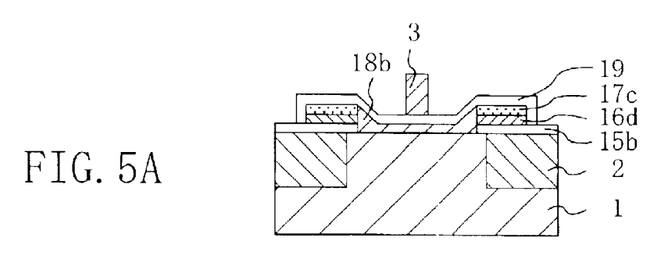
FIGS. 5A to 5D are sectional views showing steps up to a step of forming a layer-insulating film and a contact plug among fabrication steps of the MOS transistor of the second embodiment of the present invention.

Then, in the step shown in FIG. 5A, polysilicon is deposited on the substrate by using the CVD method to pattern the polysilicon layer and then form the gate electrode 3 on the silicon oxide film 19.

Figure 5B:
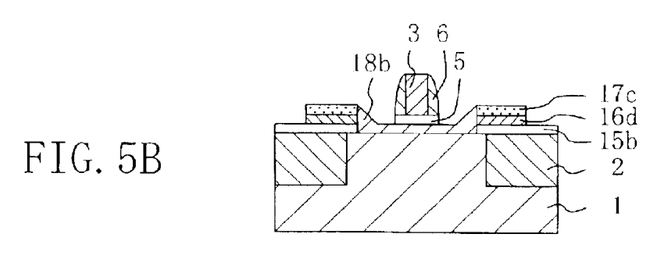

Thereafter, in the step shown in FIG. 5B, SiN is deposited on the substrate similarly to the first embodiment and then, the SiN layer is etched back and the silicon oxide film 19 is etched to form the sidewall 6 made of SiN on the side face of the gate electrode 3.

Figure 5C:
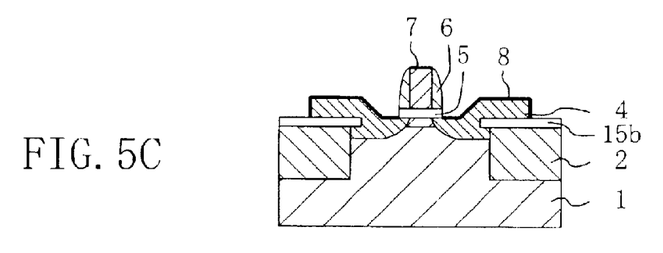

Then, in the step shown in FIG. 5C, ion implantation of n-type impurities is performed by using the gate electrode 3, sidewall 6, and gate oxide film 5 as masks to form source and drain regions 4 containing high concentration impurities in parts of the Si substrate 1 and single-crystal Si layer 18b which are located closer to both sides of the gate electrode 3, and the polysilicon layer 16d and 17c. In this case, the region immediately below the gate electrode 3 of the single-crystal Si layer 18b becomes the channel region 11 functioning as a channel. Then, by depositing a Ti film on the substrate and thermally treating the substrate, the gate silicide film 7 made of $TiSi_2$ is formed on the gate electrode 3 and the silicide film 8 is formed on the source and drain regions.

Figure 5D:
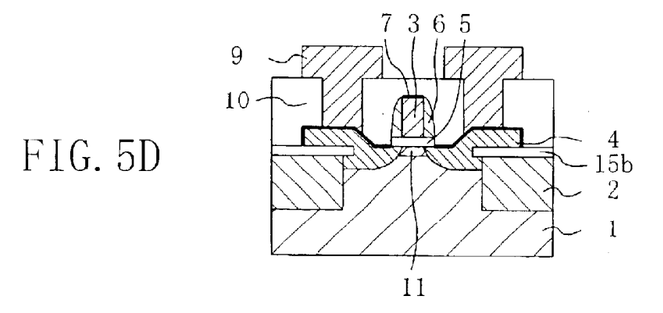

Then, in the step shown in FIG. 5D, the layer-insulating film 10 made of $SiO_2$ is formed on the substrate by thermally decomposing TEOS and then, the layer-insulating film 10 is provided with an opening through anisotropic etching to form a contact hole reaching the silicide film 8. Thereafter, the contact hole is filled with Al to form the plug 9.

Also by the above method, the MOS transistor of the first embodiment is fabricated.

The fabrication method of the MOS transistor of this embodiment is different from the case of the first embodiment in that the polysilicon layer 16b is previously formed on the isolation insulating film 2 before depositing the polysilicon layer 17a in the step shown in FIG. 4B.

According to this method, it is possible to epitaxially grow a layer serving as the channel region 11 and securely form the polysilicon layer 17a on the isolation insulating film 2 at the same time.

In general, a silicon layer is not easily formed on the surface where $SiO_2$ is exposed. Therefore, when forming a single-crystal Si layer and a polysilicon layer at the same time, the polysilicon layer formed on the $SiO_2$ film may become excessively thin. When the polysilicon layer serving as source and drain electrodes is thin, the resistance in the contact region on a source and a drain region may be increased. In the case of the fabrication method of the MOS transistor of this embodiment, because a polysilicon layer is deposited on the previously-formed polysilicon layer 16b, it is possible to securely form the polysilicon layer 17a. Thus, it is possible to improve the yield when fabricating the MOS transistor of the first embodiment by the fabrication method of this embodiment.

Though a semiconductor device fabricated by the method of this embodiment has almost the same structure of the first embodiment, the semiconductor device has a feature that a part of the source and drain regions located over the isolation insulating film has a greater thickness than the channel region 11. Moreover, it has also a feature that another silicon oxide film 15b is formed on the isolation insulating film 2. However, these features are not related to the function of a semiconductor device.

Moreover, it is possible to fabricate a p-channel MOS transistor by the fabrication method of this embodiment the same as the fabrication method of the first embodiment and fabricate a MOS transistor using a substrate such as an SOI substrate other than an Si substrate.

Embodiment 3

The fabrication method of the MOS transistor of this embodiment is a method for forming a semiconductor device of the present invention by using a SAC (self align contact) step.

FIGS. 6A to 6D and FIGS. 7A to 7D are sectional views showing fabrication steps of the MOS transistor of this embodiment.

Figure 6A:
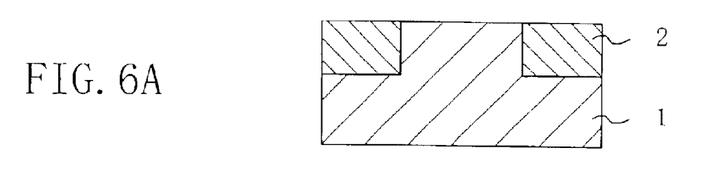
FIGS. 6A to 6D are sectional views showing steps up to a step of forming a gate electrode among fabrication steps of the MOS transistor of the third embodiment of the present invention.

First, in the step shown in FIG. 6A, an isolation insulating film 2 made of $SiO_2$ enclosing an active region is formed on an Si substrate 1 in accordance with the STI technique. Then, p-type impurities are ion-implanted into the Si substrate 1 to form a body (well) region.

Figure 6B:
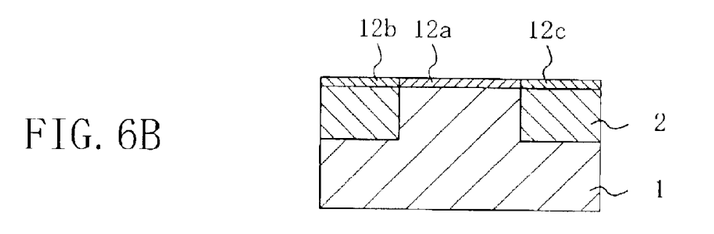

Then, in the step shown in FIG. 6B, a silicon layer is deposited on the Si substrate 1 in accordance with the LPCVD method. In this case, an epitaxially-grown single-crystal Si layer is formed on the surface of the Si substrate 1 and a polysilicon layer is formed on the isolation insulating film 2. In this case, it is important to adjust conditions so that polycrystalline silicon (polysilicon) is formed on the isolation insulating film 2. Then, for isolation from an adjacent transistor, the single-crystal Si layer and polysilicon layer are dry-etched to form polysilicon layers 12b and 12c on the isolation insulating film 2 and form a single-crystal Si layer 12a between the polysilicon layers 12b and 12c on the Si substrate 1.

Figure 6C:
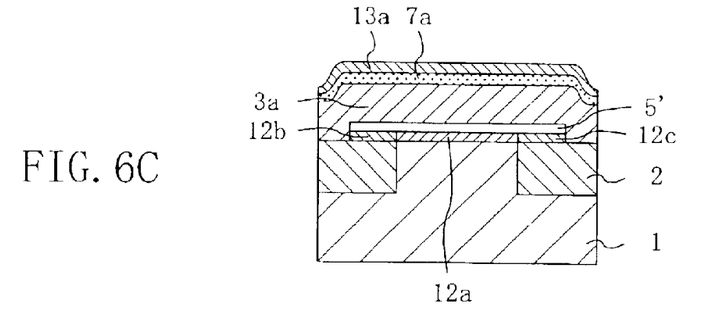

In the step shown in FIG. 6C, the polysilicon layers 12b and 12c and the single-crystal Si layer 12a are oxidized through thermal treatment to form a silicon oxide film 5' made of $SiO_2$ on the polysilicon layers 12b and 12c and the single-crystal Si layer 12a. Then, a polysilicon layer 3a is deposited on the substrate through the CVD method and then, ion implantation of n-type impurities is performed to deposit Ti on the polysilicon layer 3a. Then, by thermally treating the substrate, a silicide layer 7a made of $TiSi_2$ is formed on the polysilicon layer 3a and SiN is deposited on the silicide layer 7a to form an SiN layer 13a.

Figure 6D:
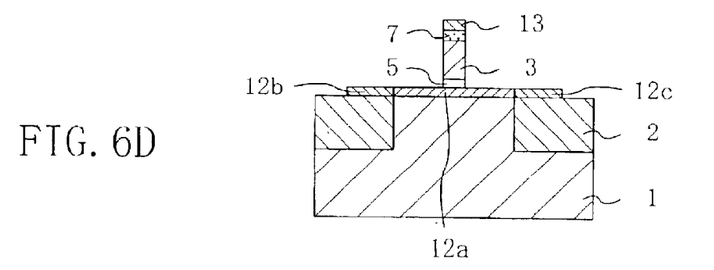

In the step shown in FIG. 6D, the silicon oxide film 5', polysilicon layer 3a, silicide layer 7a, and SiN layer 13a are patterned by using a resist mask to form a gate oxide film 5 made of $SiO_2$ on the single-crystal Si layer 12, a gate electrode 3 made of polysilicon on the gate oxide film 5, a gate silicide film 7 made of $TiSi_2$ on the gate electrode 3, and a gate cap film 13 made of SiN on the gate silicide film 7.

Figure 7A:
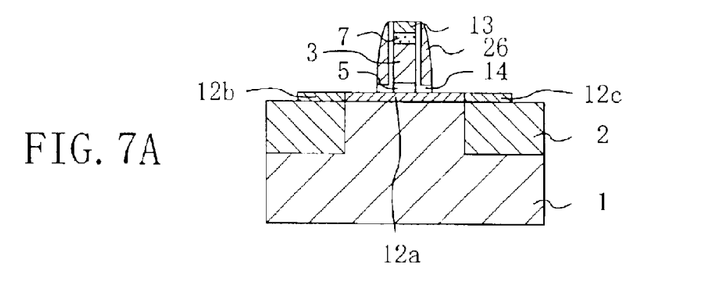
FIGS. 7A to 7D are sectional views showing steps up to a step of forming a layer-insulating film and a contact plug among fabrication steps of the MOS transistor of the third embodiment of the present invention.

Then, in the step shown in FIG. 7A, $SiO_2$ is deposited on the substrate by using the CVD method and then, SiN is deposited on the $SiO_2$ film to etch back the SiN layer. Then, the $SiO_2$ film previously deposited is dry-etched to form an L-shaped first sidewall 14 made of $SiO_2$ on side faces of the gate oxide film 5, gate electrode 3, gate silicide film 7, and gate cap film 13 and on the single-crystal Si layer 12a and a second sidewall 26 made of SiN on the first sidewall 14.

Figure 7B:
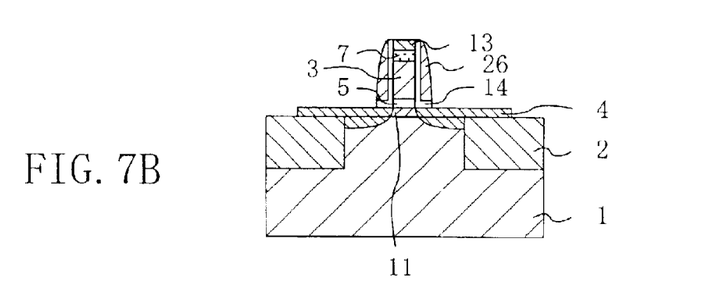

Then, in the step shown in FIG. 7B, ion implantation of n-type impurities is performed by using the gate electrode 3 and sidewall 26 as masks to form source and drain regions 4 containing impurities at a high concentration in regions containing an upper portion of the Si substrate 1 and the single-crystal Si layer 12a which is located closer to both sides of the gate electrode 3, polysilicon layers 12b and 12c. In this case, the region immediately below the gate electrode 3 of the single-crystal Si layer 12a becomes a channel region 11 functioning as a channel.

Figure 7C:
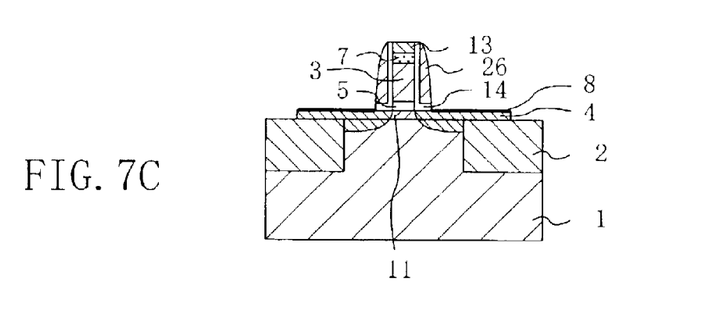

Then, in the step shown in FIG. 7C, Ti is deposited on the substrate in accordance with the CVD method and then thermal treatment is performed to form a silicide film 8 made of $TiSi_2$ on the source and drain regions 4.

Figure 7D:
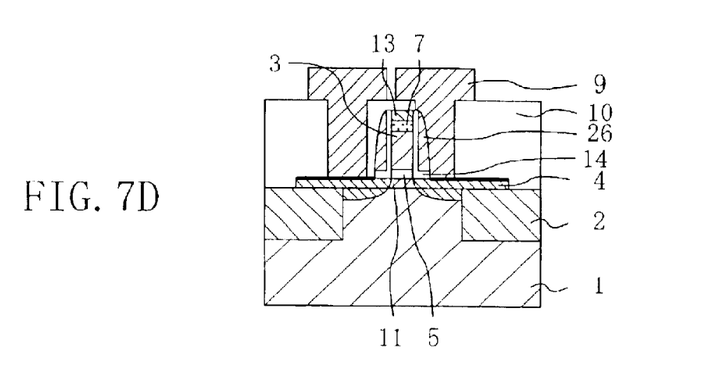

Thereafter, in the step shown in FIG. 7D, a layer-insulating film 10 made of $SiO_2$ is formed on the substrate by thermally decomposing TEOS (ethyl silicate) and then form a contact hole reaching the silicide film 8 by making openings in the layer-insulating film 10 through anisotropic etching. In this case, because the gate cap film 13 is formed on the gate electrode 3, it is possible to form the contact hole in the SAC step. Thereafter, the contact hole is filled with Al (aluminum) to form a plug 9.

By using the SAC step in the fabrication method of the semiconductor device of this embodiment, it is unnecessary to prepare an error margin for forming an etching mask and it is possible to decrease a cell size. Therefore, it is possible to further decrease a transistor in size.

Also for subsequent embodiments, it is possible to use the SAC step by forming an SiN film on a gate electrode the same as the case of this embodiment.

Embodiment 4

Figure 9:
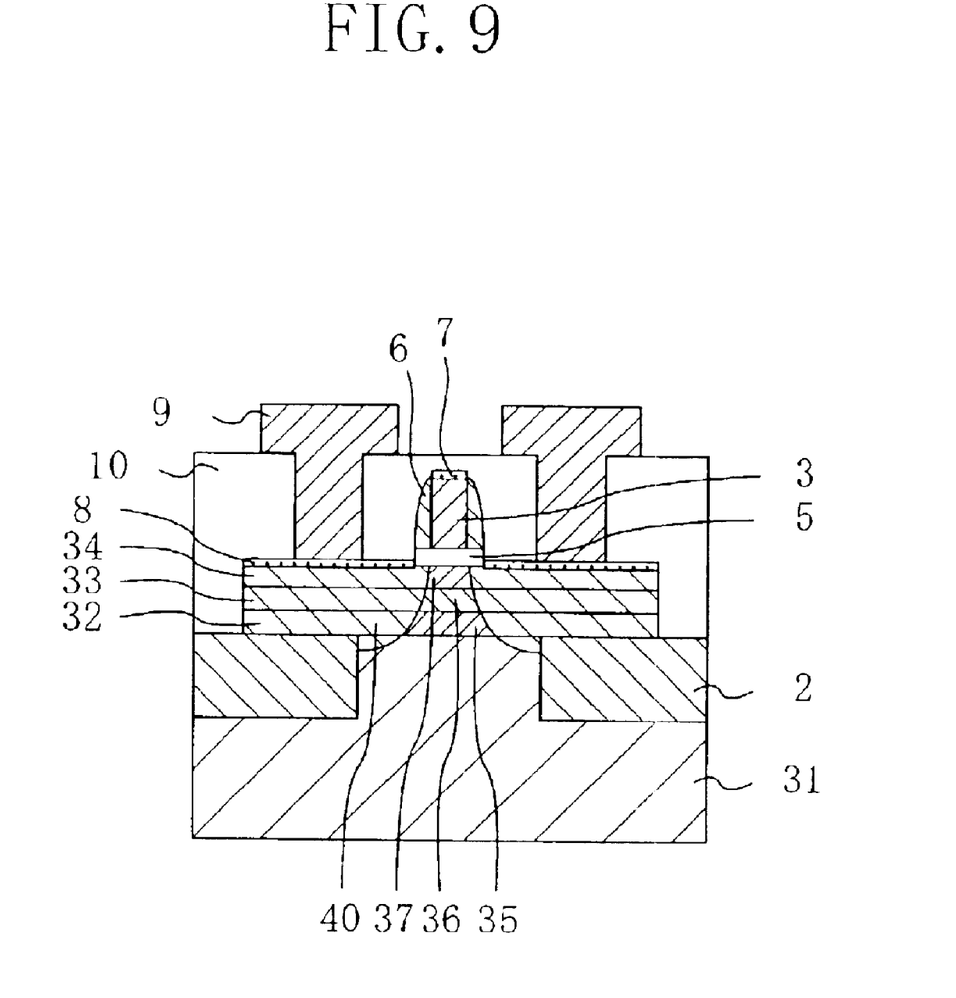
FIG. 9 is a sectional view showing a structure of a MOS transistor of a fourth embodiment of the present invention.

FIG. 9 is a sectional view showing a structure of the MOS transistor of a fourth embodiment of the present invention. The MOS transistor of this embodiment uses an SiGe layer as a channel region and its structure is almost the same as that of the MOS transistor of the first embodiment.

As shown in FIG. 9, the MOS transistor of this embodiment comprises an n-type Si substrate 31 having an active region, an isolation insulating film 2 made of $SiO_2$ formed on the Si substrate 31, an Si layer 32 formed on the active region of the Si substrate 31 and the isolation insulating film 2 through the CVD method, an SiGe layer 33 epitaxially grown on the Si layer 32 by the CVD method, an Si layer 34 deposited on the SiGe layer 33, a gate oxide film 5 made of $SiO_2$ formed on the Si layer 34, a gate electrode 3 made of polysilicon containing p-type impurities formed on the gate oxide film 5, a sidewall 6 made of SiN formed on the side face of the gate electrode 3, a gate silicide film 7 made of $TiSi_2$ formed on the gate electrode 3, source and drain regions 40 containing p-type impurities at a high concentration formed at both the sides of the gate electrode 3, a silicide film 8 made of $TiSi_2$ formed on the source and drain regions 40, a layer-insulating film 10 made of $SiO_2$ formed on the substrate, and a plug 9 passing through the layer-insulating film 10 and reaching the silicide film 8. In this case, the source and drain regions 40 include an upper portion of the Si substrate 31 and regions located at both the sides of the gate electrode 3, Si layer 32, SiGe layer 33, and Si layer 34. Moreover, regions immediately below the gate electrode 3 of the Si layer 32, SiGe layer 33, and Si layer 34 are called as an Si buffer layer 35, SiGe channel layer 36, and Si cap layer 37 respectively. Furthermore, the portion located on the isolation insulating film 2 of the Si layers 32 and 34 constitutes the source and drain regions 40 and is polycrystalline.

In the case of the MOS transistor of this embodiment, by using a material having a smaller band gap than Si such as SiGe as a channel region, it is possible to lower a threshold voltage. Moreover, even if raising the impurity concentration of the body region (portion immediately below the gate electrode on the upper portion of the Si substrate 31), it is possible to maintain a low threshold voltage. In this case, because the impurity concentration in the substrate can be raised, it is possible to control the short-channel effect such as a punch-through.

When raising the impurity concentration in the substrate, a MOS transistor using an SiGe layer as a channel has a trouble that the operation speed is lowered due to increase of a parasitic capacitance. According to the MOS transistor of this embodiment, however, by forming source and drain electrodes on the isolation insulating film 2, source-body and drain-body junction areas are decreased and a parasitic capacitance is reduced. Therefore, according to the MOS transistor of this embodiment, it is possible to realize a high-speed operation by effectively using the characteristic of SiGe.

In the case of this embodiment, a p-channel MOS transistor is described as an example. However, it is also allowed to use an n-channel MOS transistor instead.

Moreover, though this embodiment uses SiGe for a channel, it is also allowed to constitute a channel by a material such as SiGeC or SiC or use other semiconductor material. Moreover, it is possible to use a material having any content of Ge or C.

Embodiment 5

In the case of this embodiment, a DTMOS (Dynamic Threshold Voltage MOSFET) constituted by electrically connecting the gate of a MOS transistor with the body of it will be described below.

Figure 10:
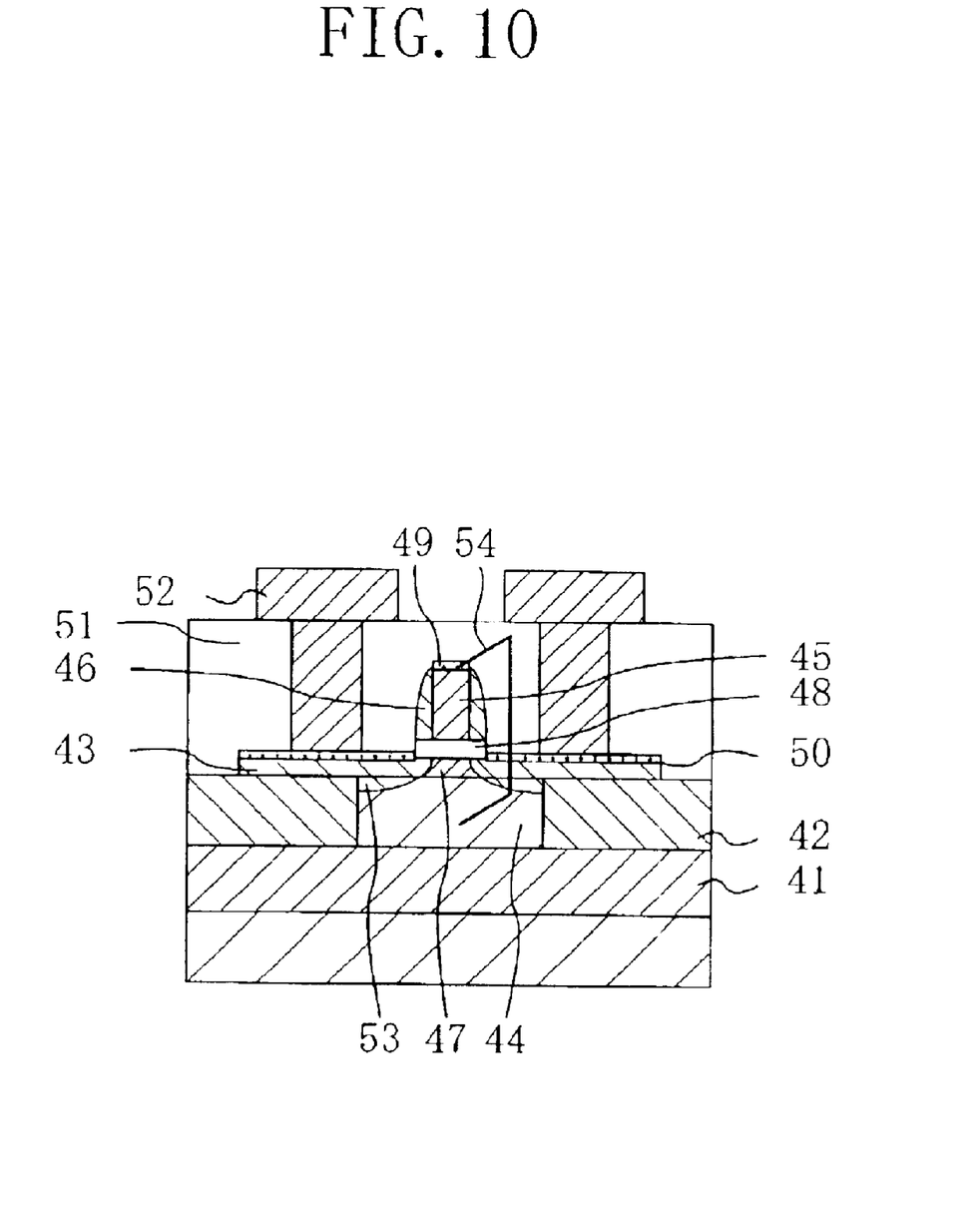
FIG. 10 is a sectional view showing a structure of a DTMOS of a fifth embodiment of the present invention.

FIG. 10 is a sectional view showing a structure of the DTMOS transistor of this embodiment. As shown in FIG. 10, the DTMOS transistor of this embodiment includes an SOI substrate 41 in which an $SiO_2$ layer is embedded, an isolation insulating film 42 made of $SiO_2$ contacting with the $SiO_2$ layer in the SOI substrate 41 to enclose an active region, an Si layer 43 epitaxially grown on the active region of the SOI substrate 41 and the isolation insulating film 42 in accordance with the CVD method, a gate oxide film 48 made of $SiO_2$ formed on the Si layer 43, a gate electrode 45 made of polysilicon formed on the gate oxide film 48, a sidewall 46 formed on the side face of the gate electrode 45, a gate silicide film 49 made of $TiSi_2$ formed on the gate electrode 45, source and drain regions 53 containing n-type impurities at a high concentration formed in regions (portions excluding the portion immediately below the gate electrode 45) located at both the sides of the gate electrode 45 on the upper portions of the Si layer 43 and SOI substrate 41, a silicide film 50 made of $TiSi_2$ formed on the source and drain regions 53, a layer-insulating film 51 made of $SiO_2$ formed on the substrate, and a plug 52 passing through the layer-insulating film 51 and reaching the silicide film 50. Moreover, a body region 44 serving as a region located immediately below the gate electrode 45 of the SOI substrate 41 is electrically connected with the gate electrode 45 through a contact 54. Wherein, though FIG. 10 shows the contact 54 as if it is provided in the section for easy understanding, it is drawn, for example, vertically toward this side from the section. Furthermore, the region present on the isolation insulating film 42 of the Si layer 43 is made of polysilicon and the Si layer 43 in the region other the above region is made of single-crystal silicon and particularly, the portion immediately below the gate electrode 45 serves as a channel region 47.

In general, a DTMOS constituted by electrically connecting a gate with a body region has a feature that the leak current when a gate bias is off is the same as that of a normal MOS transistor formed on an SOI substrate but the threshold voltage is lower than that of the normal MOS transistor when the gate bias is on. Therefore, the DTMOS has a feature that the driving force extremely increases compared to the case of a conventional MOS transistor when a gate bias is on. Moreover, in the case of the DTMOS, the longitudinal electric field on the surface of a substrate is extremely small compared to that of a conventional MOS transistor because the potential difference between gate and body regions is almost equal to zero. As a result, deterioration of mobility due to increase of the longitudinal electric field is suppressed and thereby, it is possible to increase a driving force.

However, a conventional DTMOS has a trouble that because a gate electrode is connected with a body region, the capacitance accompanying the body region is added as a gate capacitance and the gate capacitance increases compared to the case of a MOS transistor.

In the case of the DTMOS of this embodiment, because source and drain electrodes are formed above a device-separation region, the source-body and drain-body junction areas are decreased and the parasitic capacitance is reduced. Therefore, the DTMOS of this embodiment makes it possible to extremely improve the operation speed.

Moreover, by doping the body region 44 with impurities at a high concentration, it is possible to control the parasitic capacitance compared to the case of a normal MOS transistor or DTMOS. Thus, because it is possible to raise the concentration of impurities contained in the body region 44 in the case of the DTMOS of this embodiment, the following advantages can be obtained: increase of on-current, suppression of body current, expansion of operating-voltage range, and reduction of CR delay time according to lowering of body voltage. Moreover, by raising the concentration of impurities contained in the body region 44, a punch-through between source and drain is suppressed and thereby, it is possible to normally operate a device having a small gate length.

Furthermore, in the case of the DTMOS of this embodiment, the channel region 47 is epitaxially grown on the body region 44 doped with high-concentration impurities. Therefore, it is possible to form a retrograde channel profile having a steep impurity profile. As a result, because it is possible to lower a threshold voltage even if increasing a body bias coefficient, a high gate-over drive effect can be obtained even at a low threshold value and a large on-current can be obtained.

Furthermore, according to the DTMOS of this embodiment, it is possible to reduce not only a junction capacitance but also a body current because the area of the PN junction formed between a source region and a body region can be decreased.

Furthermore, because it is unnecessary to form regions for forming source and drain electrodes in an active region, it is possible to decrease the cell size of a transistor and improve the integration degree.

Therefore, it can be said that the DTMOS of this embodiment has features that the driving current is large, a high-speed operation can be performed, and the area occupied by a cell is small compared to the case of a conventional MOS transistor and DTMOS.

For this embodiment, a DTMOS using an Si layer as a channel region is described. However, the advantage described for this embodiment can be obtained even from a hetero-DTMOS using an SiGe layer or SiGeC layer as a channel region.

What is claimed is:

1. A semiconductor-device fabrication method comprising:
   a step (a) of forming an isolation insulating film for surrounding an active region in a semiconductor substrate having the active region;
   a step (b) of growing a semiconductor layer on the active region and a part of the isolation insulating film;
   a step (c) of forming a gate-insulating film and a gate electrode in the region located on the semiconductor layer on the active layer; and
   a step (d) of performing implantation of impurity ions and forming source and drain regions in parts of the semiconductor layer which are located closer to both sides of the gate electrode formed in the above step (c).

2. The semiconductor-device fabrication method of claim 1, wherein the semiconductor layer is a single-crystal layer on the active region and a polycrystalline layer on the isolation insulating film in the above step (b).

3. A semiconductor-device fabrication method comprising:
   a step (a) of forming an isolation insulating film for surrounding the active region in a semiconductor substrate having an active region;
   a step (b) of forming an insulation film on the active region and a part of the isolation insulating film;
   a step (c) of depositing a first semiconductor layer on a substrate and then forming a base semiconductor layer over a part of the isolation insulating film through patterning;
   a step (d) of forming on the substrate a second semiconductor layer over the active region and a part of the isolation insulating film;
   a step (e) of forming a gate-insulating film and a gate electrode on part of the second semiconductor layer which is located on the active region; and
   a step (f) of performing implantation of impurity ions and forming source and drain regions in parts of the first and the second semiconductor layers which are located closer to both sides of the gate electrode formed in the above step (e).

4. The semiconductor-device fabrication method of claim 3, wherein the second semiconductor layer is a single-crystal layer on the active region and a polycrystalline layer over the isolation insulating film in the step (d).

5. The semiconductor-device fabrication method of claim 3, wherein the base semiconductor layer is made of polycrystalline semiconductor.

6. A semiconductor device fabricated by a method comprising:
   a step (a) of forming an isolation insulating film for surrounding an active region in a semiconductor substrate having the active region;
   a step (b) of growing a semiconductor layer on the active region and a part of the isolation insulating film;
   a step (c) of forming a gate-insulating film and gate electrode in the region located on the semiconductor layer on the active layer; and
   a step (d) of performing implantation of impurity ions and forming source and drain regions in parts of the semiconductor layer which are located closer to both sides of the gate electrode formed in the above step (c).

7. The semiconductor device of claim 6, wherein the semiconductor layer formed in the step (b) is a single-crystal layer on the active region and a polycrystalline layer on the isolation insulating film.

8. A semiconductor device fabricated by a method comprising:
   a step (a) of forming an isolation insulating film for surrounding the active region in a semiconductor substrate having an active region;
   a step (b) of forming an insulation film on the active region and a part of the isolation insulating film;
   a step (c) of depositing a first semiconductor layer on a substrate and then forming a base semiconductor layer over a part of the isolation insulating film through patterning;
   a step (d) of forming on the substrate a second semiconductor layer over the active region and a part of the isolation insulating film;
   a step (e) of forming a gate-insulating film and a gate electrode on part of the second semiconductor layer which is located on the active region; and
   a step (f) of performing implantation of impurity ions and forming source and drain regions in parts of the first and the second semiconductor layers which are located closer to both sides of the gate electrode formed in the above step (e).

9. The semiconductor device of claim 8, wherein the second semiconductor layer formed in the step (d) is a single-crystal layer on the active region and a polycrystalline layer over the isolation insulating film.

10. The semiconductor device of claim 8, wherein the base semiconductor layer is made of polycrystalline semiconductor.

* * * * *